(12) United States Patent
Kao et al.

(10) Patent No.: US 10,145,535 B1
(45) Date of Patent: Dec. 4, 2018

(54) LIGHT SOURCE DEVICE AND LIGHT SOURCE SYSTEM THEREOF

(71) Applicant: Darwin Precisions Corporation, Taichung (TW)

(72) Inventors: Chen-Chia Kao, Taichung (TW); Yu-Shan Shen, Taichung (TW)

(73) Assignee: DARWIN PRECISIONS CORPORATION, Taichung (TW)

( * ) Notice: Subject to any disclaimer, the term of this patent is extended or adjusted under 35 U.S.C. 154(b) by 0 days.

(21) Appl. No.: 15/822,663

(22) Filed: Nov. 27, 2017

(51) Int. Cl.
*F21V 5/00* (2018.01)
*F21V 5/08* (2006.01)
*F21K 9/69* (2016.01)

(52) U.S. Cl.
CPC . *F21V 5/08* (2013.01); *F21K 9/69* (2016.08)

(58) Field of Classification Search
USPC .......................................................... 362/336
See application file for complete search history.

(56) References Cited

U.S. PATENT DOCUMENTS

2013/0051056 A1* 2/2013 Okubo ................. F21S 48/1154
362/520

* cited by examiner

*Primary Examiner* — Jamara Franklin
(74) *Attorney, Agent, or Firm* — WPAT, PC

(57) ABSTRACT

A light source device includes a lens and a light source. The lens has a light-emitting top surface, and the light source is for generating light and is disposed below the lens. Light from the light source is refracted by the lens to cause a light distribution to be produced when projected onto a planar surface parallel to the light-emitting top surface. A light source system includes a plurality of the light source devices disposed in a matrix arrangement. Through the light distribution produced by the lens of the light source devices and the light source system, high contrast effects may be generated and subsequently replace conventional light distributions.

18 Claims, 3 Drawing Sheets

Conventional lighting

Collimated
lighting of
present invention

LIGHT SOURCE DEVICE AND LIGHT SOURCE SYSTEM THEREOF

BACKGROUND

1. Technical Field

The present disclosure generally relates to a light source device and light source system thereof; particularly, the present invention relates to a light source device and light source system thereof that can generate a high contrast light distribution pattern.

2. Description of the Related Art

Within various technical fields, especially to the field of display technology and illumination equipments, the design of light sources has always been an important aspect of light sources. Conventional light sources typically utilize light bulbs or incandescent tubes as light sources. As the technology of light-emitting diodes (LED) has matured and since LEDs have advantages of being small and being environmentally friendly by saving energy, LEDs have gradually become a mainstay on the market.

However, light sources for displays are typically designed to direct light at wider angles such that when multiple light sources are arranged together, the aggregate light output is more uniform. Although this setup allows for a more uniform light output, the contrast levels between the light sources cannot be controlled effectively enough to allow local dimming effects to be achieved.

SUMMARY

It is an objective of the present disclosure to provide a light source device and a light source system thereof for producing local dimming effects.

According to one aspect of the invention, a light source device is provided. The light source device includes a lens and a light source. The lens has a light-emitting top surface, and the light source is for generating light and is disposed below the lens. Light from the light source is refracted by the lens to cause a light distribution to be produced when projected onto a planar surface parallel to the light-emitting top surface exhibiting the following: along a cross-section of the planar surface through a center axis, where the center axis is perpendicular to the planar surface and runs through the center of the light source, a maximum or substantially maximum light illuminance level is achieved from the center axis to a first light turning point on the cross-section, wherein the first light turning point is a point where, from 10 mm away from the center axis to the first light turning point, a rate of acceleration of decrease in light illuminance level changes to being greater than 0.003 $mm^{-2}$, and the rate of decrease in light illuminance level for each increase in 1 mm is smaller than 0.015 $mm^{-1}$ along a same direction on the cross-section between 10 mm from the center axis and the first light turning point.

According to another aspect of the invention, a light source device is provided. The light source device includes a lens and a light source. The lens has a light-emitting top surface, and the light source is for generating light and is disposed below the lens. Light from the light source is refracted by the lens to cause a light distribution to be produced when projected onto a planar surface parallel to the light-emitting top surface exhibiting the following: at a first light turning point at a first distance along the planar surface from a center axis, where the center axis is perpendicular to the planar surface and runs through the center of the light source, a maximum or substantially maximum light illuminance level is achieved, wherein the first light turning point is a point where, from 10 mm away from the center axis to the first light turning point, a rate of acceleration in the decrease in light illuminance level changes to being greater than 0.003 $mm^{-2}$, and the rate of decrease in light illuminance level for each increase in 1 mm is smaller than 0.015 $mm^{-1}$ along a same direction on the cross-section between 10 mm from the center axis and the first light turning point.

According to yet another aspect of the invention, a light source system including a plurality of the light source devices is provided, wherein the plurality of light source devices are disposed in a matrix arrangement.

DETAILED DESCRIPTION OF THE PREFERRED EMBODIMENT

Figure 1:
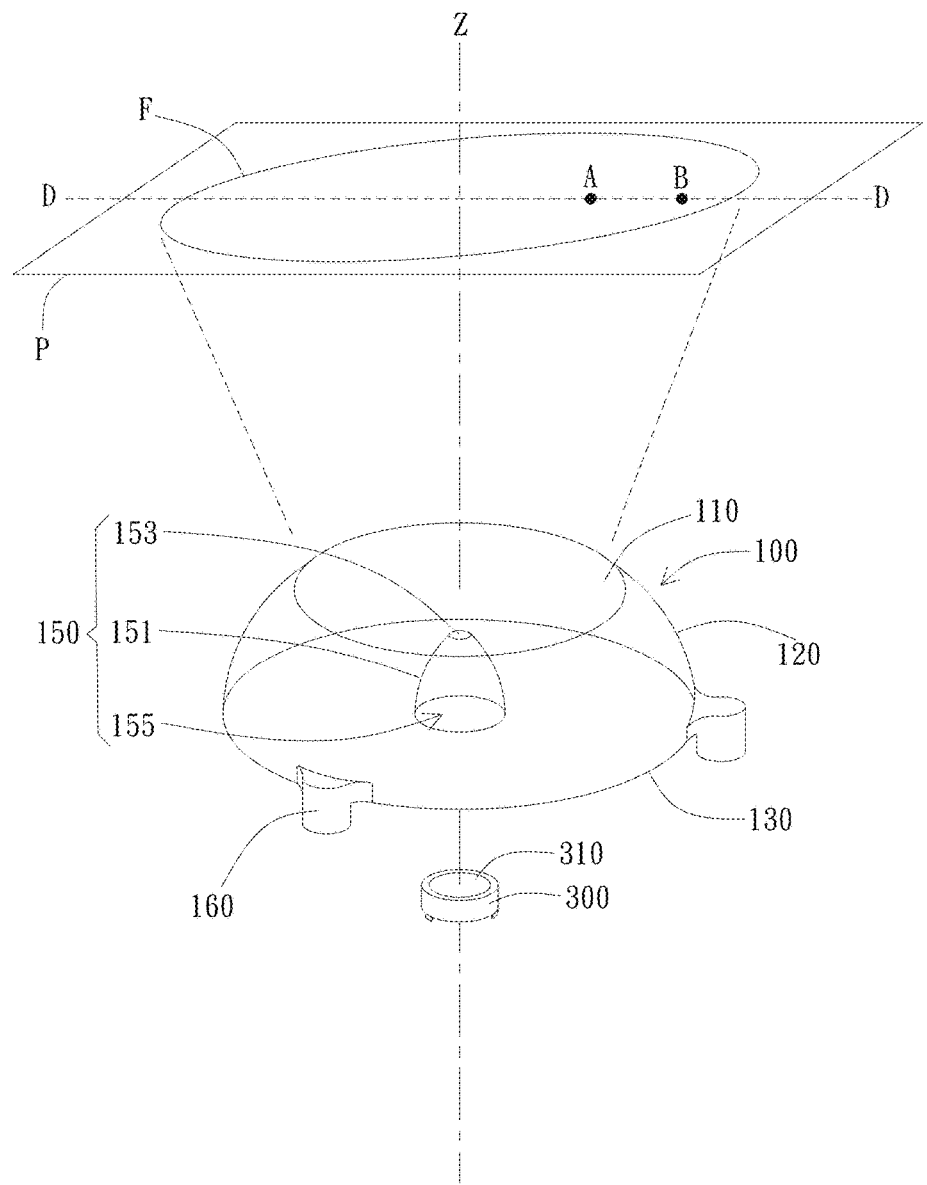
FIG. 1 is an exploded view of an embodiment of the light source device of the present invention.

Embodiments of the present invention provide a light source device for local dimming effects. In the following detailed description, references are made to the accompanying drawings that form a part hereof, and in which are shown by way of illustration specific embodiments or examples. These embodiments are only illustrative of the scope of the present invention, and should not be construed as a restriction on the present invention. Referring now to the drawings, in which like numerals represent like elements through the several figures, aspects of the present invention and the exemplary operating environment will be described.

The present disclosure provides a light source device. In a preferred embodiment, the light source device is a light-emitting diode (LED) light source device. However, in other different embodiments, the light source device may also utilize other light sources that have an illumination area.

FIG. 1 is an embodiment of the light source device of the present invention. The light source device includes a lens 100 and a light source 300. The lens 100 has a light-emitting top surface 110, a bottom surface 130 opposite to the light-emitting top surface 110, and an outer wall surface 120 extending and connecting from the bottom surface 130 to the light-emitting top surface 110. In the present embodiment, the light-emitting top surface 110 and the bottom surface 130 are in the shape of a circle. However, in other different embodiments, the light-emitting top surface 110 and the bottom surface 130 may also be in any other shape. The light-emitting top surface 110 may also be a circular shape while the bottom surface 130 may be of a different shape (or vice-versa). The light-emitting top surface 110 is preferably smaller than the bottom surface 130, wherein the outer wall surface 120 preferably forms a convex curvature to make the entire structure of the lens 100 to be essentially a convex structure. The lens 100 preferably is formed of a transparent material, such as transparent plastic or glass. However, in other different embodiments, the lens 100 may also be formed from materials with light transmittance properties, wherein there may be an inclusion of different types of particles.

As shown in FIG. 1, a hole 150 recessed towards the light-emitting top surface 110 is formed above the bottom surface 130, wherein the hole 150 is preferably bullet shaped. The hole 150 is formed from the surrounding of an inner wall surface 151 and an inner top surface 153. The inner top surface 153 is connected to the top of the inner wall surface 151. In other words, the inner top surface 153 is connected to the inner wall surface 151 at the hole 150 to the portion that is relatively closer to the light-emitting top surface 110. An opening 155 is formed from the hole 150 being surrounded by the inner wall surface 151 on the bottom surface 130. The inner top surface 153 and the opening 155 are preferably circular shapes. However, in other different embodiments, the inner top surface 153 and the opening 155 may also be of any other shapes.

As shown in FIG. 1, the inner top surface 153 and a projection area corresponding to light emitted on the light-emitting top surface 110 from the inner top surface 153, or a projection area of the inner top surface 153 on the light-emitting top surface 110, are preferably flat surfaces. In other words, the inner top surface 153 and the projection area corresponding to light from the inner top surface 153 onto the light-emitting top surface 110 are coplanar surfaces. However, in other different embodiments, there may not be the inner top surface 153. In other words, the inner wall surface 151 may form the bullet shape without the inner top surface 153 on top.

As shown in FIG. 1, the light source 300 is disposed below the bottom surface 130 of the lens 100 and corresponds to the hole 150. In an embodiment, the light source 300 is disposed below the opening 155 of the hole 150. The light source 300 has an illumination area 310 directed towards the hole 150

In the present embodiment, the light source 300 is preferably a light-emitting diode (LED). However, in other different embodiments, the light source 300 may also be of other types of directional or partially directional light-emitting devices. The opening 155 of the hole 150 covers the projection area of the light emitted from the illumination area 310 onto the bottom surface 130. Through this design, light emitted out from the illumination area 310 may be completely emitted or substantially be emitted into the hole 150 through the opening 155.

As shown in FIG. 1, light generated by the light source 300 and emitted out from the illumination area 310 is emitted into the hole 150 through the opening 155. The light then enters the lens 100 through the inner wall surface 151 and the inner top surface 153.

In the present embodiment, the direction of a majority of the light emitting into the lens 100 from the inner top surface 153 is substantially perpendicular to the inner top surface 153 (angle of entrance is substantially 0 degrees). Therefore, light emitting from the inner top surface 153 is able to successfully pass through the inner top surface 153 onto the corresponding projection area of the light-emitting top surface 110 and then leave the light-emitting top surface 110. This decreases the chances of total reflection such that a dark spot is prevented from being produced in the center, while also decreasing rings of strong light from forming outside of the dark spot, which effectively increases the light smoothness.

As illustrated in FIG. 1, when light is emitted out from the light source device and projected onto a planar surface P, a light distribution F will be produced. In the present embodiment, the planar surface P is coplanar with the light-emitting top surface 110 of the lens 100, wherein the light-emitting top surface 110 is a flat or substantially flat surface. The light distribution F, in the present embodiment, is a circular shape corresponding to the circular shape of the lens 100 (when taking a top-down view of the lens 100). However, in other different embodiments, the light distribution F may be any other different shape corresponding to different shapes of the lens 100.

In the present embodiment, when light exiting the lens 100 is projected onto the planar surface P, a center axis Z that runs through the center of the light source 300 and the lens 100 will be perpendicular to the planar surface P. In addition, since the planar surface P is coplanar with the light-emitting top surface 110 of the lens 100, the center axis Z will run through the center (or substantially the center) of the light distribution F.

Figure 2:
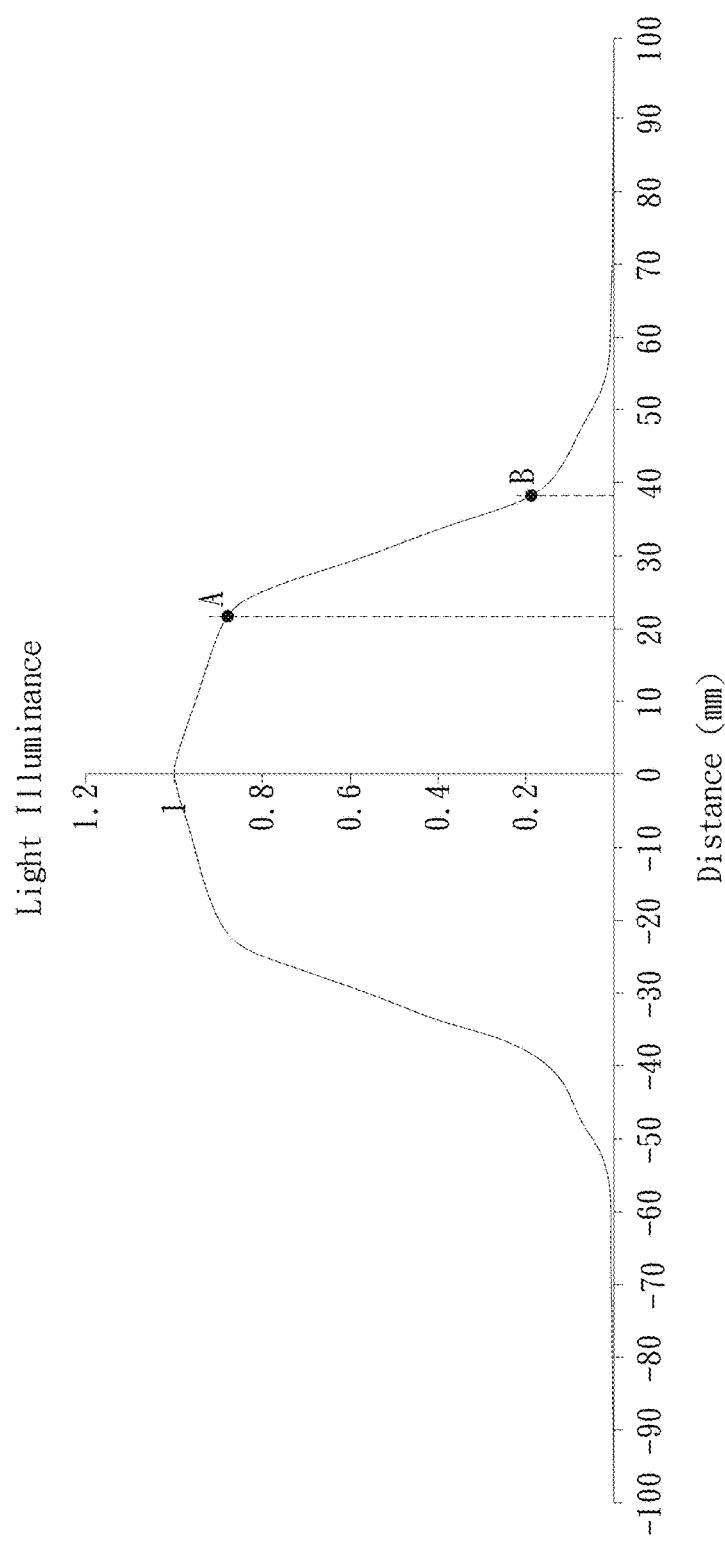
FIG. 2 is an embodiment of the light illuminance levels of the light distribution produced by the light source device.

FIG. 2 is a light illuminance graph of the light distribution F of FIG. 1 when viewed from the cross-section D-D. As shown in FIGS. 1 and 2, the light distribution F exhibits maximum or substantially maximum light illuminance levels in the vicinity of the center axis Z. Between a first light turning point A along the cross-section D-D from the center axis Z, the light illuminance level is consistently high. In the present embodiment, the lens 100 is separated from the planar surface P by a distance of 2 mm to 40 mm along the center axis Z.

In one embodiment, at a point 10 mm away from the center axis Z to the first light turning point A on the planar surface P along the cross-section D-D, the rate of decrease in light illuminance level on the planar surface P for each increase in 1 mm is smaller than 0.015 $mm^{-1}$ along a same direction on the cross-section between 10 mm from the center axis and the first light turning point A. In other words, along a same direction on the cross-section D-D between 10 mm from the center axis Z and the first light turning point A, the rate of decrease in light illuminance is significantly small for each increase in 1 mm between the point 10 mm from the center axis Z toward the first light turning point A. In this manner, the area encompassing the distance from the center axis Z to the first light turning point A on the planar surface P can be maintained to have maximum or substantially maximum light illuminance.

In the present embodiment, at the point 10 mm away from the center axis Z to the first light turning point A on the planar surface P, the rate of acceleration of decrease in light illuminance level changes to being greater than 0.003 $mm^{-2}$ at the first light turning point A. In other words, from the cross-section D-D of FIG. 1, the light illuminance level significantly drops off at the first light turning point A, as also seen in the light illuminance graph of FIG. 2.

As shown in FIGS. 1 and 2, after the first light turning point A, the light illuminance drops off until a second light turning point B is reached where the light illuminance is at 0.2. In the present embodiment, the average total sum of the light illuminance level for each 1 mm past the second light turning point B from the center axis Z along the cross-section D-D to a point C having light illuminance level of 0.01 is greater than 0.04. In other words, after the second light turning point B, the rate of acceleration in the decrease of the light illuminance level decreases. In this manner, when multiple light sources are arranged together, light from the first light turning point A to past the second light turning point B of one light source device would overlap with that of another light source device to produce a relatively uniform light when all the light source devices are turned on at the same output levels.

In the present embodiment, from the first light turning point A to the second light turning point B, a rate of acceleration in the decrease in light illuminance level for each increase in 1 mm changes to being smaller than 0.01 mm$^{-2}$.

Figure 3A:
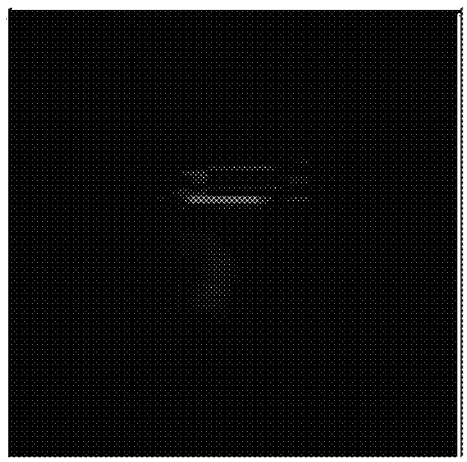
FIG. 3A is an embodiment of the light distribution pattern formed from a multiple of conventional light source devices.

FIG. 3A illustrates the light distribution when a multiple of conventional light source devices are arranged together. As shown in FIG. 3A, because the light illuminance level does not drop off significantly, the contrast level between each of the conventional light source devices in the arrangement is low.

Figure 3B:
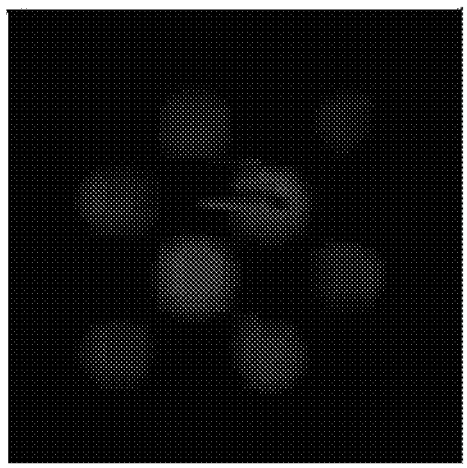
FIG. 3B is an embodiment of the contrast produced between a multiple of light source devices of the present invention.

In contrast to the light distribution of FIG. 3A, when a multiple or plurality of the light source devices of the present invention is arranged together to form a light source system (as illustrated in FIG. 3B), since the illuminance levels in the light distribution patterns of each of the light source devices remains relatively high (as measured from the center axis to the first light turning point A of each light source device), the contrast levels between light source devices in the multiple light source device arrangement can be increased. A major benefit of this increased contrast level, as shown in FIG. 3B, is that local dimming effects can be achieved by modulating the output levels of specific individual or groups of light source devices within the multiple light source device arrangement. This local dimming effect would not be possible under normal circumstances with conventional light source devices since contrast levels are significantly lower between conventional light source devices, and as such no noticeable dimming effect would be observed in conventional displays. In the present embodiment, the plurality of the light source devices may be arranged or disposed in a matrix arrangement. However, in other different embodiments, the plurality of light source devices may be arranged in any other different configurations to suit any design requirements.

Although the embodiments of the present invention have been described herein, the above description is merely illustrative. Further modification of the invention herein disclosed will occur to those skilled in the respective arts and all such modifications are deemed to be within the scope of the invention as defined by the appended claims.

What is claimed is:
1. A light source device, comprising:
  a lens having a light-emitting top surface; and
  a light source for generating light and disposed below the lens;
  wherein the light from the light source is refracted by the lens to cause a light distribution to be produced when projected onto a planar surface parallel to the light-emitting top surface exhibiting the following:
  along a cross-section of the planar surface through a center axis, where the center axis is perpendicular to the planar surface and runs through the center of the light source, a maximum or substantially maximum light illuminance level is achieved from the center axis to a first light turning point on the cross-section, wherein the first light turning point is a point where, from 10 mm away from the center axis to the first light turning point, a rate of acceleration of decrease in light illuminance level changes to being greater than 0.003 mm$^{-2}$, and the rate of decrease in light illuminance level for each increase in 1 mm is smaller than 0.015 mm$^{-1}$ along a same direction on the cross-section between 10 mm from the center axis and the first light turning point.

2. The light source device of claim 1, wherein the light-emitting top surface is at a distance of between 2 mm to 40 mm from the planar surface along the center axis.

3. The light source device of claim 1, wherein a second light turning point is at a position along the cross-section that is farther away from the center axis than the first light turning point.

4. The light source device of claim 3, wherein the light illuminance level at the second light turning point is 0.2.

5. The light source device of claim 4, wherein an average total sum of the light illuminance level for each 1 mm past the second light turning point from the center axis along the cross-section to a point having light illuminance level of 0.01 is greater than 0.04.

6. The light source device of claim 5, wherein a rate of acceleration of decrease in light illuminance level for each increase in 1 mm is smaller than 0.01 mm$^{-2}$ from the first light turning point to the second light turning point.

7. The light source device of claim 1 wherein for each 1 mm past a point 10 mm from the center axis along the cross-section to the first light turning point the rate of decrease in light illuminance level is smaller than 0.015 mm$^{-1}$.

8. The light source device of claim 1, wherein the light-emitting top surface is flat and the lens has a bottom surface opposite to the light-emitting top surface, wherein the bottom surface concaves towards the light-emitting top surface to form a hole, and the bottom surface has a gouge surrounding the hole with an inclination towards the edge of the hole, and the light source is disposed below the bottom surface corresponding to the hole.

9. A light source device, comprising:
  a lens having a light-emitting top surface; and
  a light source for generating light and disposed below the lens;
  wherein the light from the light source is refracted by the lens to cause a light distribution to be produced when projected onto a planar surface parallel to the light-emitting top surface exhibiting the following:
  at a first light turning point at a first distance along the planar surface from a center axis, where the center axis is perpendicular to the planar surface and runs through the center of the light source, a maximum or substantially maximum light illuminance level is achieved, wherein the first light turning point is a point where, from 10 mm away from the center axis to the first light turning point, a rate of acceleration in the decrease in light illuminance level at changes to being greater than 0.003 mm$^{-2}$, and the rate of decrease in light illuminance level for each increase in 1 mm is smaller than 0.015 mm$^{-1}$ along a same direction on the cross-section between 10 mm from the center axis and the first light turning point.

10. The light source device of claim 9, wherein the light-emitting top surface is at a distance of between 2 mm to 40 mm from the planar surface along the center axis.

11. The light source device of claim 9, wherein along a same direction along the planar surface, a second light turning point is at a position that is farther away from the center axis than the first light turning point.

12. The light source device of claim 11, wherein the light illuminance level at the second turning point is 0.2.

13. The light source device of claim 12, wherein an average total sum of the light illuminance level for each 1 mm past the second turning point from the center axis along the same direction on the planar surface to a point having light illuminance level of 0.01 is greater than 0.04.

14. The light source device of claim 9, wherein for each 1 mm past a point 10 mm from the center axis along the planar surface to the first light turning point the rate of decrease in light illuminance level is smaller than 0.015 mm$^{-1}$.

15. The light source device of claim 9, wherein the light-emitting top surface is flat, and the lens has a bottom surface opposite to the light-emitting top surface, and the bottom surface concaves towards the light-emitting top surface to form a hole, and the bottom surface has a gouge surrounding the hole with an inclination towards the edge of the hole.

16. The light source device of claim 15, wherein the gouge has a curvature at an end of the inclination away from the hole.

17. The light source device of claim 15, wherein the hole is formed from the surrounding of a first inner wall surface and a second inner wall surface with an opening on the bottom surface.

18. The light source device of claim 17, wherein the first inner wall surface and the second inner wall surface form a bullet structure.

* * * * *